United States Patent
Pang et al.

(10) Patent No.: US 7,936,853 B2
(45) Date of Patent: May 3, 2011

(54) FALSE FREQUENCY LOCK DETECTOR

(75) Inventors: Simon Pang, San Diego, CA (US); Viet Linh Do, Carlsbad, CA (US); Mehmet Mustafa Eker, San Marcos, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 670 days.

(21) Appl. No.: 11/983,675

(22) Filed: Nov. 9, 2007

(65) Prior Publication Data

US 2009/0122935 A1   May 14, 2009

(51) Int. Cl.
*H04L 7/00* (2006.01)
(52) U.S. Cl. .................. 375/354; 331/DIG. 2; 327/141; 327/160
(58) Field of Classification Search .......... 375/354–355, 375/359–360, 373; 327/159, 141, 160; 331/DIG. 2
See application file for complete search history.

(56) References Cited

U.S. PATENT DOCUMENTS

| | | | |
|---|---|---|---|
| 6,331,792 B1 * | 12/2001 | Tonietto | 327/48 |
| 6,853,696 B1 * | 2/2005 | Moser et al. | 375/375 |
| 7,424,082 B2 * | 9/2008 | Choi | 375/371 |
| 7,668,271 B2 * | 2/2010 | Kim et al. | 375/354 |
| 2004/0001483 A1 * | 1/2004 | Schmidt et al. | 370/364 |

* cited by examiner

*Primary Examiner* — Jean B Corrielus
(74) *Attorney, Agent, or Firm* — Law Office of Gerald Maliszewski; Gerald Maliszewski

(57) ABSTRACT

A system and method are provided for detecting a false clock frequency lock in a clock and data recovery (CDR) device. The method accepts a digital raw data signal at a first rate and counts edge transitions in the raw data signal, creating a raw count. A clock signal is also accepted at a second rate. The clock signal is a timing reference recovered from the raw data signal. The raw data signal is sampled at a rate responsive to the clock signal, generating a sampled signal. Edge transitions are counted in the sampled signal, creating a sampled count. Then, the raw count is compared to the sampled count, to determine if the first rate is equal to the second rate. The method is used to determine if the second rate is less than the first rate—to detect if the clock signal is incorrectly locked to the first rate.

20 Claims, 3 Drawing Sheets

US 7,936,853 B2

FALSE FREQUENCY LOCK DETECTOR

BACKGROUND OF THE INVENTION

1. Field of the Invention

This invention generally relates to clock and data recovery (CDR) communications and, more particularly, to a system and method for detecting a clock false frequency lock condition in a CDR device.

2. Description of the Related Art

To efficiently transmit digital information distances longer than the internal bus of a computer, the information can be serialized to encode the bit stream and clock together. The resulting signal is less affected by noise and the transfer function of the transmission medium, as the data and clock experience the same delay. At the receiving end, the timing information is extracted, and the bit stream regenerated. Many classes of digital data streams, especially high-speed serial data streams, are sent as a "raw" stream of data without an accompanying clock. Conventionally, the approximate frequency or baud rate of the raw data is known, the receiver generates a clock from a frequency reference, and then phase-aligns to the reference clock to transitions in the raw data stream using a phase-locked loop (PLL). This process is commonly known as CDR.

In order for the clock to be recovered from raw data, the data stream must transition frequently enough to correct for any drift in the PLL's oscillator. The limit as to how long a clock recovery unit can operate without a transition is known as the maximum consecutive identical digits (CID) specification. To ensure frequent transitions, some sort of encoding is conventionally used; 8B/10B encoding is very common, while Manchester encoding serves the same purpose in old revisions of 802.3 local area networks.

The received information is inevitably affected by some deterioration, as the recovered signals are not exactly synchronous with the transmit clock. Thus, timing information that is essentially carried by the level transitions of the received signal is affected by the noise and by the intersymbol interference. Delay is acquired due to physical transit time and latencies in the receive circuitry.

Conventionally, the clock recovery unit associated with the CDR relies on the pre-programmed ratio between a reference clock (refclk) and the frequency of the input data stream. The recovered clock frequency and the refclk frequency are compared using two frequency counters. If the amount of time it takes the two frequency counter to overflow is about the same, it is concluded that no false locking has occurred. This method of clock recovery requires that the CDR be set up with a particular oscillator(s) and the PLL programmed for particular division ratios. Once the CDR is set up, it is difficult to modify, so as to accept new of different frequencies.

Further, the CDR is prone to false locking. False locking occurs when data stream input to the CDR is not at the same frequency as the recovered clock. This problem is especially prevalent if the CDR is expected to simultaneously recover multiple information streams at different data rates, or if a single received data stream operates at more than one rate.

It would be advantageous if the clock frequency of a raw data stream could be recovered without a refclk frequency. It would be advantageous if the clock frequency of a raw data stream could be recovered without a priori knowledge of the approximate frequency of the data.

SUMMARY OF THE INVENTION

A detector is presented that examines the recovered data and clock stream output from a CRU and the raw input data stream. The transition count (Tr) of the recovered data stream is stored. Simultaneously, the transition count (Ti) of the input data stream is stored. When Tr reaches a predefined limit (N), Ti is examined. If Ti is significantly larger than N, a false lock is identified. From this comparison a conclusion can be drawn that the recovered clock is running slower than the rate of the input data stream. If Ti is approximately equal to Tr, the conclusion can be drawn that the recovered clock is running at the rate that is the same, or faster than the rate of the input data stream.

Accordingly, a method is provided for detecting a false clock frequency lock in a clock and data recovery (CDR) device. The method accepts a digital raw data signal at a first rate and counts edge transitions in the raw data signal, creating a raw count. A clock signal is also accepted at a second rate. The clock signal is a timing reference recovered from the raw data signal. The raw data signal is sampled at a rate responsive to the clock signal, generating a sampled signal. Edge transitions are counted in the sampled signal, creating a sampled count. Then, the raw count is compared to the sampled count, to determine if the first rate is equal to the second rate.

More explicitly, the method is used to determine if the second rate is less than the first rate by comparing a raw count first value to a sampled count second value, smaller than the first value. The saved sampled count is initially compared to a threshold value. Once the threshold exceeded, the saved raw count is compared to the saved sampled count, and in response to determining that the second rate is less than the first rate, the clock signal is detected as incorrectly locked to the first rate.

Additional details of the above-described method and a system for detecting a false clock frequency lock in a CDR device are provided below.

DETAILED DESCRIPTION

Figure 1:
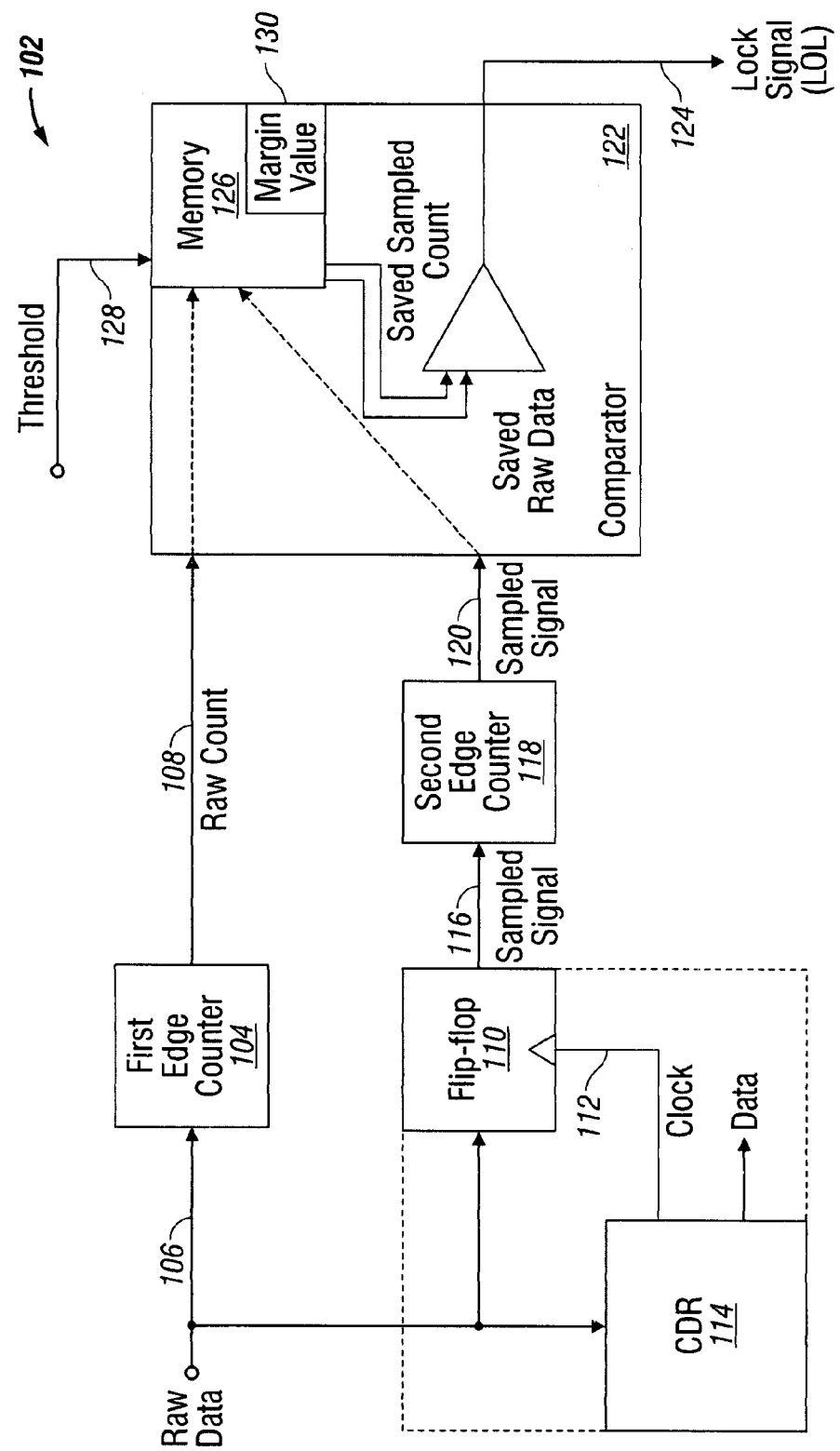
FIG. 1 is a schematic block diagram a system for detecting a false clock frequency lock in clock and data recovery (CDR).

FIG. 1 is a schematic block diagram a system for detecting a false clock frequency lock in clock and data recovery (CDR). The system 102 comprises a first edge counter 104 having an input on line 106 to accept a digital raw data signal at a first rate or first frequency. The edge counter 104 counts edge transitions in the raw data signal and supplies a raw count at an output on line 108. A flip-flop 110 has an input on line 106 to accept the raw data signal and an input on line 112 to accept a clock signal at a second rate recovered from the raw data signal on line 106. As shown, the clock signal is supplied by clock and data recovery device 114. The flip-flop 110 samples the raw data signal at the second rate and supplies a sampled signal at an output on line 116. In some aspects, as represented by the dotted lines, the flip-flop 110 is embedded with the CDR 114.

Typically, the raw data signal accepted by the first edge counter on line 106 is a non-return-to-zero (NRZ) raw data signal. NRZ is a binary line code in which "1s" are represented by one significant condition and "0s" are represented by the other significant condition, with no other neutral or rest condition. NRZ is not inherently a self-synchronizing code, so some additional synchronization technique (e.g., a run length limited constraint, or a parallel synchronization signal) must be used to avoid bit slip. For a given data signaling rate, i.e., bit rate, the NRZ code requires only half the bandwidth required by the Manchester code. When used to represent data in an asynchronous communication scheme, the absence of a neutral state requires other mechanisms for data recovery, to replace methods used for error detection when using synchronization information when a separate clock signal is available. Some NRZ variations include Unipolar Non-Return-to-Zero Level, Bipolar Non-Return-to-Zero Level, Non-Return-to-Zero Mark, Non-Return-to-Zero Space, and Non-Return-to-Zero Inverted (NRZI).

A second edge counter 118 has an input on line 116 to accept the sampled signal. The second edge counter 118 counts edge transitions in the sampled signal and supplies a sampled count at an output on line 120. A comparator 122 has an input on line 108 to accept the raw count and an input on line 120 to accept the sampled count. The comparator 122 compares the raw count to the sampled count and determines if the first rate is equal to the second rate. A lock signal is supplied at an output on line 124 in response to the determination.

In one aspect, the comparator 122 determines that the second rate is less than the first rate and supplies a loss-of-lock (LOL) at the output on line 124. The LOL signal indicates that the clock signal is incorrectly locked to the first rate. The comparator 122 determines that the second rate is less than the first rate by comparing a raw count first value to a sampled count second value, smaller than the first value. In some aspects a "margin" may be used. For example, a determination may be made that second rate is less than the first rate if the second count value, plus some additional margin value, is less than the first count value. Alternately, a margin may be used to reduce the first count value. The first and second counts, and margin may also be expressed and manipulated as relative percentages. The margin may be a safety factor to minimize a false trigger due to noise for example. It should also be understood the first or second counts may include implicitly a margin that is not expressly mentioned.

However, if the comparator 122 compares a raw count first value to a sampled count second value, greater than, or equal to the first value, then a determination is made that second rate is greater than, or equal to the first rate. That is, no LOL signal is supplied for the condition when the second rate exceeds, or is equal to the first rate.

In another aspect, the comparator 122 includes a memory 126 and an input on line 128 to accept a threshold value. The comparator 122 saves the sampled and raw counts in the memory 126 and compares the saved sampled count to the threshold. When the saved sampled count exceeds the threshold value, a determination is made that the second rate is less than the first rate if the saved raw count value is greater than the saved sampled count value. If a margin value 130 is used, it may be stored in memory 126.

Alternately, the comparator 122 may compare the saved raw count to the threshold. When the saved raw count exceeds the threshold value, a determination is made that the second rate is less than the first rate if the saved raw count value is greater than the saved sample count value.

Figure 2:
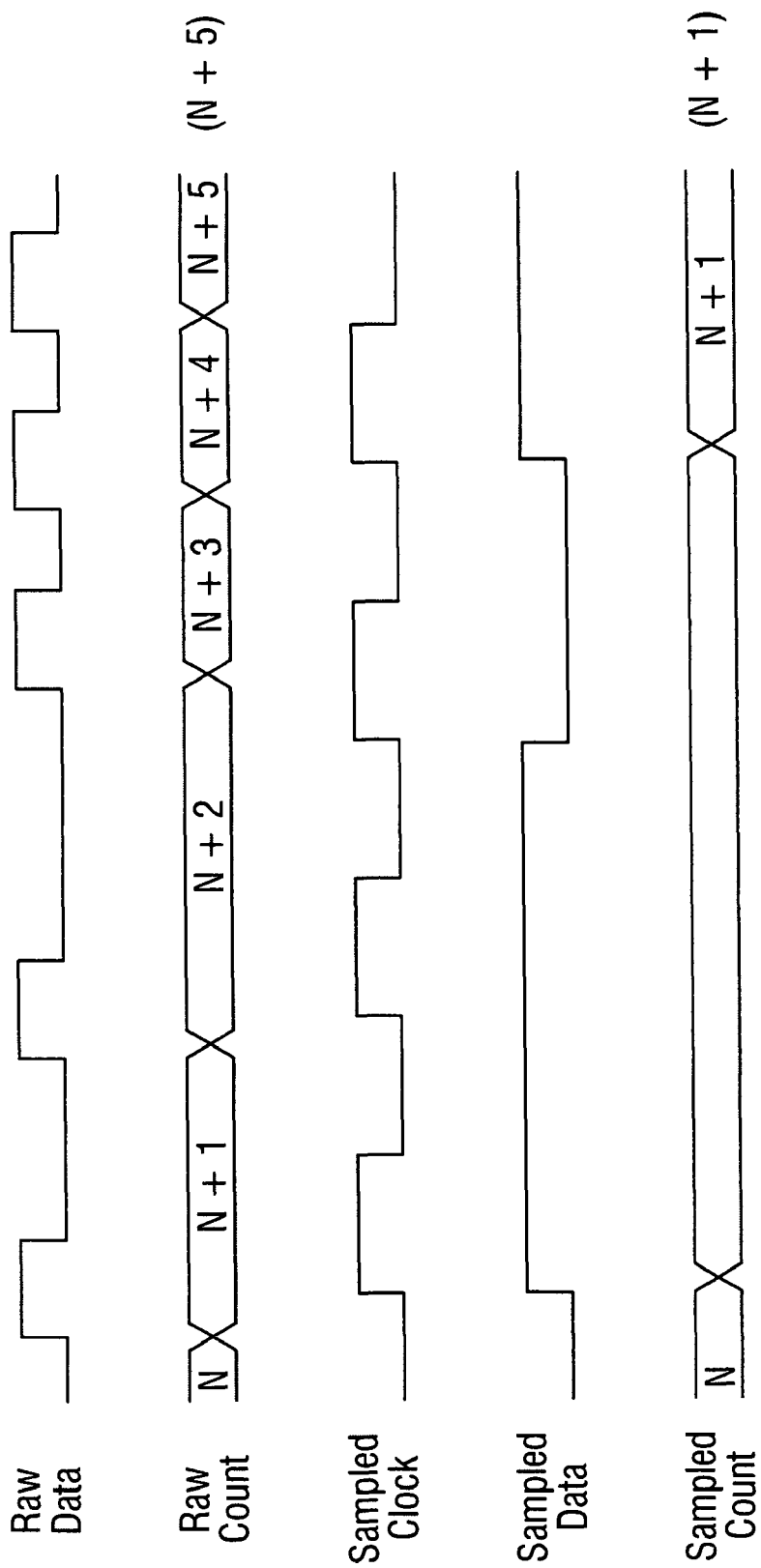
FIG. 2 is a timing diagram illustrating the signals used in determining that a loss of lock has occurred.

FIG. 2 is a timing diagram illustrating the signals used in determining that a loss of lock has occurred. This example depicts a case where the rising edges of the sampled and raw data are being counted. Shown is a raw data signal. A raw count of "N+5" is accumulated, in contrast to the sampled count of "N+1". The sample count being smaller than the raw count is an indication that the clock frequency (second rate) is slower than the raw data frequency (first rate).

As shown in the figure, only the positive transitions in the raw data are being counted. However, the system works equally well if the first and second edge counters count only negative edge transitions, or both positive and negative edge transitions.

Viewing both FIGS. 1 and 2, the clock second rate may lose synchronization with the raw data as a result of a change (increase) in the raw data rate. For example, the first edge counter 104 and flip-flop 110 may initially accept a second raw data signal at the second rate. The CDR 114 likewise accepts the second raw data signal supplies the clock signal with the second rate on line 112. Initially, both the raw data and clock have the second rate, and the clock is locked to the correct frequency.

Subsequently, the CDR 114, first edge counter 104, and flip-flop 110 accept a first raw data signal at the first rate, faster than the second rate. The loss-of-lock condition occurs if the CDR 114 continues to supply the clock signal at the second rate. Then, the comparator 122 determines that the second rate is less than the first rate and supplies an LOL on line 124.

Although the system has been depicted as a connection of modules, implying hardware circuitry, it should be understood that aspects of the system may be enabled using instructions stored in memory and enabled using a microprocessor or logic-coded state machine.

Functional Description

Figure 3:
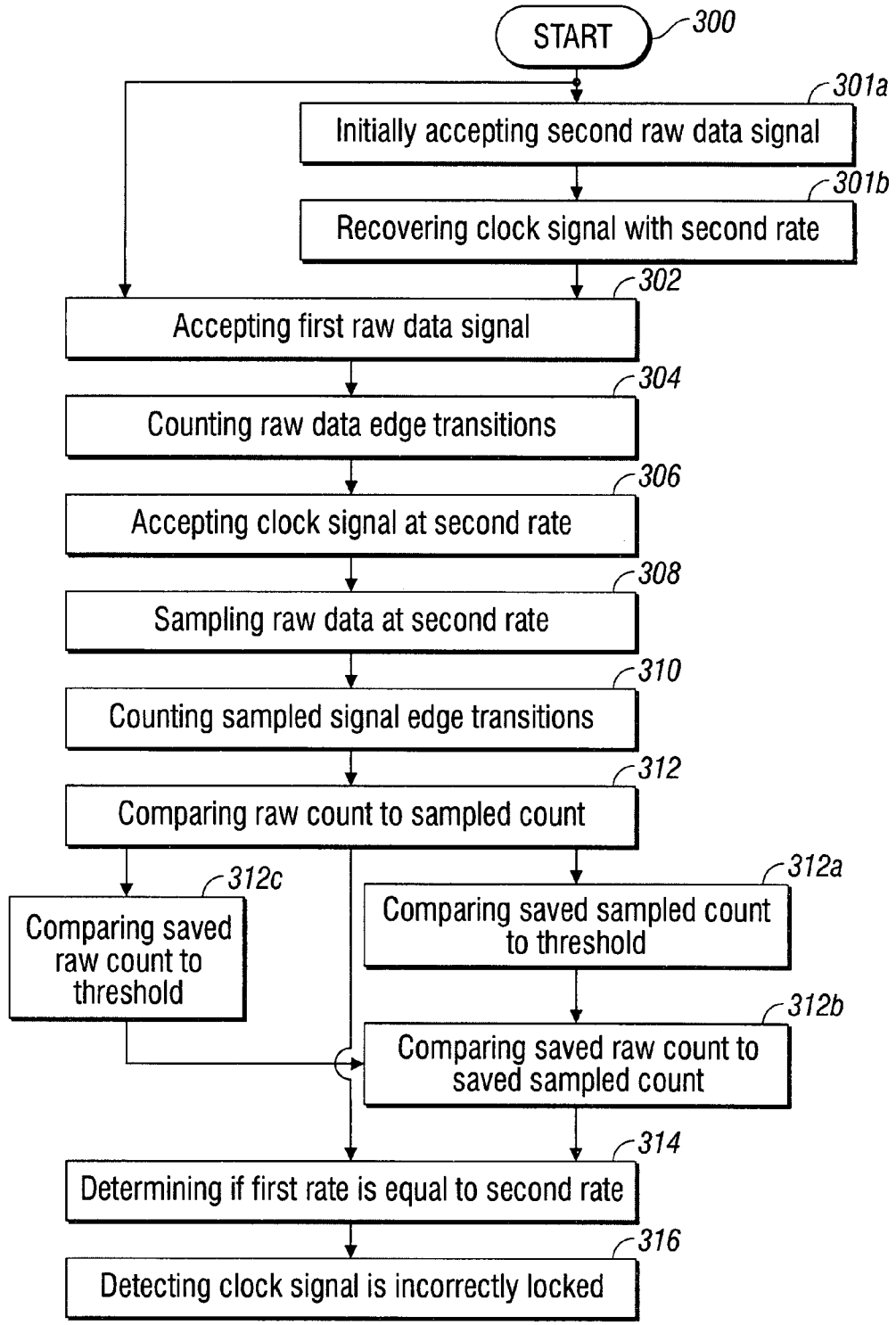
FIG. 3 is a flowchart illustrating a method for detecting a false clock frequency lock in a CDR device.

FIG. 3 is a flowchart illustrating a method for detecting a false clock frequency lock in a CDR device. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 300.

Step 302 accepts a digital raw data signal at a first rate. For example, the raw data signal may be an NRZ signal. Step 304 counts edge transitions in the raw data signal, creating a raw count. Step 306 accepts a clock signal at a second rate, recovered from the raw data signal. Step 308 samples the raw data signal at a rate responsive to the clock signal, generating a sampled signal. Step 310 counts edge transitions in the sampled signal, creating a sampled count. Step 312 compares the raw count to the sampled count. Step 314 determines if the first rate is equal to the second rate.

Counting edge transitions in the raw data signal (Step 304) and counting edge transitions in the sampled signal (Step 310) may include counting positive edge transitions (only), negative edge transitions (only), or both positive and negative edge transitions.

In one aspect, determining if first rate is equal to the second rate in Step 314 includes determining that the second rate is less than the first rate. More explicitly, comparing the raw count to the sampled count in Step 312 includes comparing a raw count first value to a sampled count second value, smaller than the first value, as follows. Step 312a compares a saved sampled count to a threshold value. When the saved sampled count exceeds the threshold, Step 312b compares a saved raw count to the saved sampled count. Then, determining that the second rate is less than the first rate in Step 314 includes determining that the second rate is less than the first rate if the saved raw count is greater than the saved sampled count.

Alternately, Step 312*c* compares a saved raw count to a threshold value. When the saved raw count exceeds the threshold, Step 312*b* compares the saved raw count value to a saved sampled count. Then, Step 314 determines that the second rate is less than the first rate if the saved raw count is greater than the saved sampled count. In response determining that the second rate is less than the first rate, Step 316 detects that the clock signal is incorrectly locked to the first rate.

In another aspect, Step 301*a* initially accepts a second raw data signal at the second rate. Step 301*b* recovers the clock signal with the second rate from the second raw data signal. Then, accepting the raw data signal at the first rate in Step 302 includes accepting a first raw data signal subsequent to accepting the second raw data signal.

In another aspect, comparing the raw count to the sampled count in Step 312 includes comparing a raw count first value to a sampled count second value, greater than, or equal to the first value. Then, Step 314 determines that second rate is greater than, or equal to the first rate.

A system and method have been providing for detecting a false clock frequency lock in a CDR device. Examples of circuit modules and process steps have been given to illustrate the invention. However, the invention is not limited to just these examples. Other variations and embodiments of the invention will occur to those skilled in the art.

We claim:

1. In a clock and data recovery (CDR) device, a method for detecting a false clock frequency lock, the method comprising
   accepting, at an edge counter, a digital raw data signal at a first rate;
   counting edge transitions in the raw data signal, creating a raw count;
   accepting a clock signal at a second rate, recovered from the raw data signal;
   sampling the raw data signal at a rate responsive to the clock signal, generating a sampled signal;
   counting edge transitions in the sampled signal, creating a sampled count;
   comparing the raw count to the sampled count; and,
   determining if the first rate is equal to the second rate.

2. The method of claim 1 wherein determining if first rate is equal to the second rate includes determining that the first rate is not equal to the second rate and that the second rate is less than the first rate.

3. The method of claim 2 wherein comparing the raw count to the sampled count includes comparing a raw count first value to a sampled count second value, smaller than the first value.

4. The method of claim 3 wherein comparing the raw count to the sampled count includes:
   comparing a saved sampled count to a first value;
   when the saved sampled count exceeds the first value, comparing a saved raw count to the saved sampled count; and,
   wherein determining that the second rate is less than the first rate includes determining that the second rate is less than the first rate if the saved raw count is greater than the saved sampled count.

5. The method of claim 3 wherein comparing the raw count to the sampled count includes:
   comparing a saved raw count to a first value;
   when the saved raw count exceeds the first value, comparing the saved raw count value to a saved sampled count; and,
   wherein determining that the second rate is less than the first rate includes determining that the second rate is less than the first rate if the saved raw count is greater than the saved sampled count.

6. The method of claim 2 further comprising:
   in response determining that the second rate is less than the first rate, detecting that the clock signal is incorrectly locked to the first rate.

7. The method of claim 1 wherein accepting the raw data signal at the first rate includes accepting a non-return-to-zero (NRZ) signal.

8. The method of 1 further comprising:
   initially accepting a second raw data signal at the second rate;
   recovering the clock signal with the second rate from the second raw data signal; and,
   wherein accepting the raw data signal at the first rate includes accepting a first raw data signal subsequent to accepting the second raw data signal.

9. The method of claim 1 wherein comparing the raw count to the sampled count includes comparing a raw count first value to a sampled count second value, greater than, or equal to the first value; and,
   wherein determining if first rate is equal the second rate includes determining that the first rate is not equal to the second rate and the second rate is greater than, or equal to the first rate.

10. The method of claim 1 wherein counting edge transitions in the raw data signal and counting edge transitions in the sampled signal includes counting edge transitions selected from a group consisting of positive edge transitions, negative edge transitions, and both positive and negative edge transitions.

11. In clock and data recovery (CDR), a system for detecting a false clock frequency lock, the system comprising:
   a first edge counter having an input to accept a digital raw data signal at a first rate, the edge counter counting edge transitions in the raw data signal and supplying a raw count at an output;
   a flip-flop having an input to accept the raw data signal and an input to accept a clock signal at a second rate recovered from the raw data signal, the flip-flop sampling the raw data signal at the second rate and supplying a sampled signal at an output;
   a second edge counter having an input to accept the sampled signal, the second edge counter counting edge transitions in the sampled signal and supplying a sampled count at an output; and,
   a comparator having an input to accept the raw count and an input to accept the sampled count, the comparator comparing the raw count to the sampled count, determining if the first rate is equal to the second rate, and supplying a lock signal at an output in response to the determination.

12. The system of claim 11 wherein the comparator determines that the second rate is less than the first rate and supplies a loss-of-lock (LOL) signal at the output.

13. The system of claim 12 wherein the comparator compares a raw count first value to a sampled count second value, smaller than the first value, and determines that the second rate is less than the first rate.

14. The system of claim 13 wherein the comparator includes a memory and an input to accept a first value, the comparator saving the sampled and raw counts in the memory and comparing the saved sampled count to the first value, and when the saved sampled count exceeds the first value, determining that the second rate is less than the first rate if the saved raw count value is greater than the saved sampled count value.

15. The system of claim 13 wherein the comparator includes a memory and an input, to accept a first value, the comparator saving the sampled and raw counts in the memory and comparing the saved raw count to the first value, and when the saved raw count exceeds the first value, determining that the second rate is less than the first rate if the saved raw count value is greater than the saved sample count value.

16. The system of claim 12 wherein the comparator supplies the LOL signal, indicating that the clock signal is incorrectly locked to the first rate.

17. The system of claim 11 wherein the first edge counter and flip-flop accept a non-return-to-zero (NRZ) raw data signal.

18. The system of claim 11 wherein the first edge counter and flip-flop initially accept a second raw data signal at the second rate; the system further comprising:

a CDR having an input, to accept the second raw data signal and an output to supply the clock signal with the second rate;

wherein the CDR, first edge counter, and flip-flop subsequently accept a first raw data signal at the first rate, faster than the second rate, and the CDR continues to supply the clock signal at the second rate; and, wherein the comparator determines that the second rate is less than the first rate and supplies a loss-of-lock (LOL) signal.

19. The system of claim 11 wherein the comparator compares a raw count first value to a sampled count second value, greater than, or equal to the first value, and determines that second rate is greater than, or equal to the first rate.

20. The system of claim 11 wherein the first and second edge counters count edge transitions selected from a group consisting of positive edge transitions, negative edge transitions, and both positive and negative edge transitions.

* * * * *